(12) United States Patent
Chen et al.

(10) Patent No.: US 8,519,790 B2
(45) Date of Patent: *Aug. 27, 2013

(54) POWER AMPLIFIER LINEARIZATION USING CANCELLATION-BASED FEED FORWARD METHODS AND SYSTEMS

(71) Applicants: Wei Chen, Newark, CA (US); Wilhelm Steffen Hahn, Los Altos, CA (US)

(72) Inventors: Wei Chen, Newark, CA (US); Wilhelm Steffen Hahn, Los Altos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/716,564

(22) Filed: Dec. 17, 2012

(65) Prior Publication Data

US 2013/0106509 A1    May 2, 2013

Related U.S. Application Data

(63) Continuation of application No. 13/051,469, filed on Mar. 18, 2011, now Pat. No. 8,358,170.

(60) Provisional application No. 61/316,608, filed on Mar. 23, 2010, provisional application No. 61/345,909, filed on May 18, 2010, provisional application No. 61/375,491, filed on Aug. 20, 2010.

(51) Int. Cl.
    *H03F 1/32* (2006.01)

(52) U.S. Cl.
    CPC .................................. *H03F 1/3223* (2013.01)
    USPC ......................................................... 330/151

(58) Field of Classification Search
    CPC ...................................................... H03F 1/3223
    USPC ................................................ 330/149, 151
    See application file for complete search history.

(56) References Cited

U.S. PATENT DOCUMENTS 7,301,397 B2 * 11/2007 Arbab et al. .................. 330/151

* cited by examiner

*Primary Examiner* — Steven J Mottola
(74) *Attorney, Agent, or Firm* — King & Spalding

(57) ABSTRACT

Linearizers can improve the linearity of power amplifiers by canceling or reducing amplitude of non-linearity components, (e.g., IM3, IM5, IM7, IM9, etc.) generated by the power amplifier. The linearizers can obtain samples of signals output by the power amplifier and process the samples to produce a canceling signal that is applied onto or into an output of the power amplifier. The canceling signal is generated such that when applied to the output of the power amplifier, the canceling signal cancels or reduces at least a portion of the non-linearity components produced by the power amplifier. A controller can improve the correction of the non-linearity components by executing one or more tuning algorithms and adjusting settings of the linearizer based on the results of the algorithm(s).

17 Claims, 13 Drawing Sheets

POWER AMPLIFIER LINEARIZATION USING CANCELLATION-BASED FEED FORWARD METHODS AND SYSTEMS

CROSS REFERENCE TO RELATED APPLICATIONS

The present application is a continuation under 35 U.S.C. § 120 of U.S. Non-provisional patent application Ser. No. 13/051,469, now U.S. Pat. No. 8,358,170, filed on Mar. 18, 2011, which claims to the benefit of United States Provisional Patent Application No. 61/316,608, entitled "Power Amplifier Linearization Using Cancellation-Based Feed Forward Method and System," and filed Mar. 23, 2010, United States Provisional Patent Application No. 61/345,909, entitled "Power Amplifier Linearization Using Cancellation-Based Feed Forward Method and System," filed May 18, 2010, and United States Provisional Patent Application No. 61/375,491, entitled "Methods and Systems for Noise and Interference Cancellation" and filed Aug. 20, 2010. The entire contents of each of the foregoing priority applications are hereby incorporated herein by reference.

Figure 1:
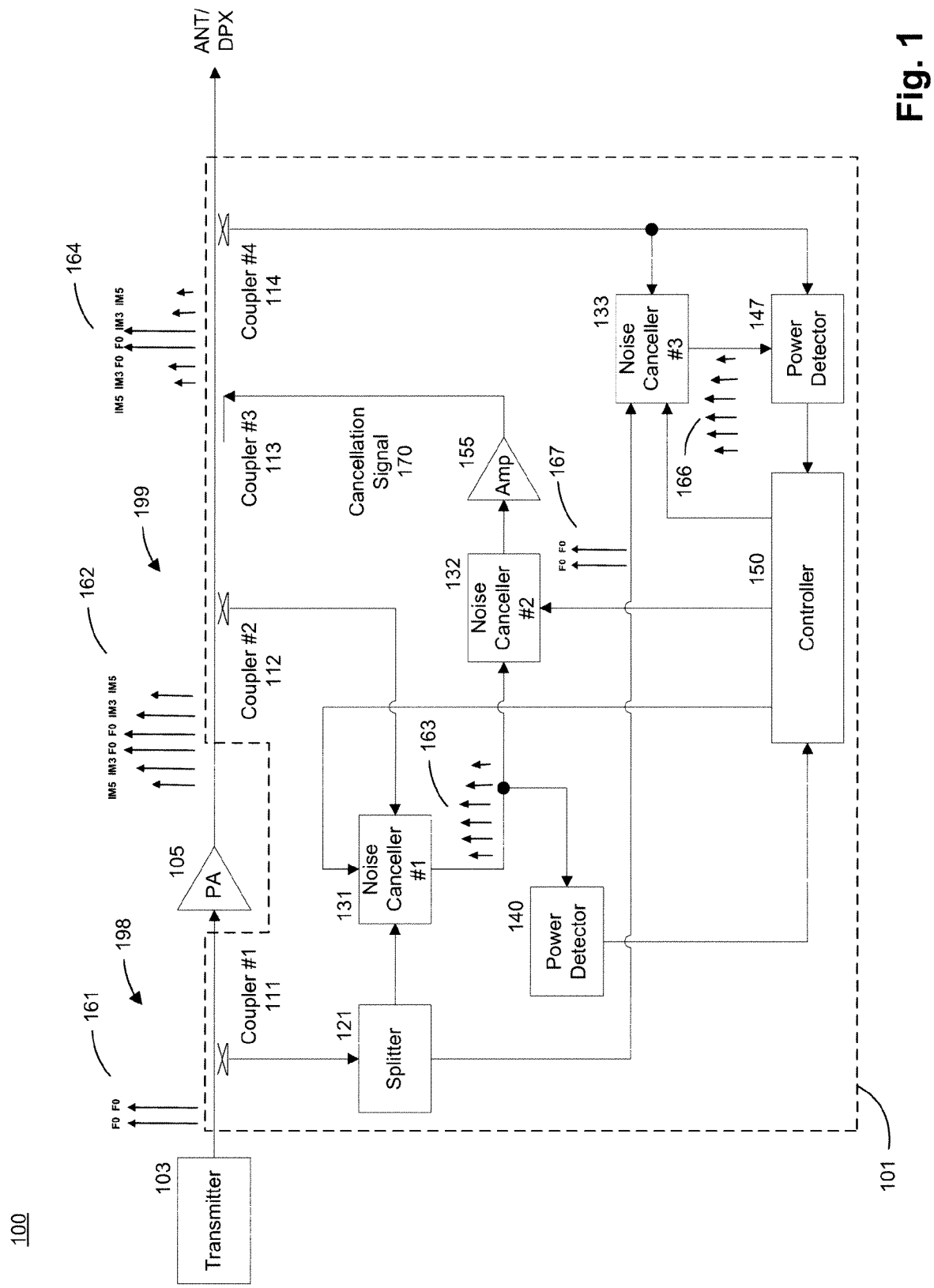
FIG. 1 is a functional block diagram of a system having a linearizer for improving the linearity of a power amplifier, in accordance with certain exemplary embodiments.

Many aspects of the invention can be better understood with reference to the above drawings. The drawings illustrate only exemplary embodiments of the invention and are therefore not to be considered limiting of its scope, as the invention may admit to other equally effective embodiments. The elements and features shown in the drawings are not necessarily to scale, emphasis instead being placed upon clearly illustrating the principles of exemplary embodiments of the present invention. Additionally, certain dimensions may be exaggerated to help visually convey such principles. In the drawings, reference numerals designate like or corresponding, but not necessarily identical, elements.

DETAILED DESCRIPTION OF EXEMPLARY EMBODIMENTS

The present invention is directed to methods and systems for improving the linearity of power amplifiers by canceling or reducing unwanted spectral components, such as non-linearity components (e.g., IM3, IM5, IM7, IM9, etc.), noise, and spurs, generated by the power amplifier or another component (e.g., intermediate frequency ("IF") power amplifier or mixer) in a transmit chain. Exemplary embodiments described herein can support canceling, correcting, addressing, or compensating for intermodulation products, interference, electromagnetic interference ("EMI"), noise, or other unwanted spectral components. With improved linearity, the Adjacent Channel Power Ratio ("ACPR"), the output power, and/or the power consumption of the power amplifier can be improved. This increase in output power and/or reduction of power consumption results in an increase in power amplifier efficiency ("PAE").

Turning now to the drawings, in which like numerals indicate like (but not necessarily identical) elements throughout the figures, exemplary embodiments of the invention are described in detail. FIG. 1 is a functional block diagram depicting a system 100 having a linearizer 101 for improving the linearity of a power amplifier 105, in accordance with certain exemplary embodiments. The exemplary linearizer 101 improves the linearity of the power amplifier 105 by canceling or reducing amplitude of non-linearity components of signals output by the power amplifier 105. Referring to FIG. 1, the power amplifier 105 is disposed along an input path 198 to receive and amplify signals 161 transmitted by a transmitter 103 and output amplified signals 162 onto an output path 199. In this exemplary embodiment, the signal 161 has fundamental tones F0 in the radio frequency ("RF") band. However, the linearizer 101 is not limited to the RF band, but instead can be used to improve the linearity of signals in other frequency bands, applications (e.g., cable television amplifiers, and test equipment, such as automatic test equipment ("ATE") and generators), or parts of the signal path (e.g., intermediate frequencies ("IFx")). In certain exemplary embodiments, the signal 161 includes multiple carriers, such as in the case of a cellular base-station. In certain exemplary embodiments, the signal 161 includes multiple sub-carriers as in the case of Orthogonal Frequency-Division Multiplexing ("OFDM").

The power amplifier 105 adjusts the amplitude of the signal 161 from the transmitter 103 and outputs an amplitude adjusted signal 162. As described in further detail below, the linearizer 101 improves the linearity of the power amplifier 105 by processing one or more samples of the output signal 162 from the power amplifier 105. In certain exemplary embodiments, the power amplifier 105 includes a single-stage amplifier and the linearizer 101 processes the output signal 162 from the single stage amplifier. In certain alternative exemplary embodiments, the power amplifier includes a multi-stage amplifier and the linearizer 101 processes the output signal 162 from the final stage or any intermediate stage of the multi-stage amplifier.

When a power amplifier 105 adjusts the amplitude of an input signal 161, non-linearity spectral components or inter-modulation products, such as intermodulation products IM3, IM5, IM7, IM9, etc., can be introduced onto the output signal 162. For example, the output signal 162 is illustrated as having two fundamental tones F0 and their respective third-order intermodulation products IM3 and fifth-order intermodulation products IM5. Intermodulation products and other unwanted non-linearity spectral components can degrade the performance of the power amplifier 105 by reducing the ACPR and/or causing an increase in the power consumption of the power amplifier 105. The linearizer 101 can reduce, suppress, or cancel these unwanted spectral components using a feed-forward method described below.

Although the output signal 162 is illustrated in FIG. 1 with fundamental tones F0 having an amplitude substantially similar to the amplitude of the fundamental tones F0 of the input signal 161, the amplitude of the fundamental tones F0 of the output signal 162 can be greater than or less than the amplitude of the fundamental tones F0 of the input signal 161. Thus, the power amplifier 105 can have a gain of "N," where N is any number positive or negative.

The exemplary linearizer 101 includes a first coupler 111 for sampling the transmitted signal 161 along the input path of the power amplifier 105 to obtain a clean sample of the signal 161 having the fundamental tones F0 but prior to the introduction of intermodulation products. This sampled signal is passed to a splitter 121 that provides the sampled signal to noise cancellers 131 and 133.

A second coupler 112 is connected to the output of the power amplifier 105 to sample the output signal 162 having the fundamental tones F0 and the intermodulation products introduced onto the transmitted signal 161 by the power amplifier 105 (or another component in the transmit chain). This sampled signal is sent to the noise canceller 131.

The noise canceller 131 deducts the sampled input signal received from splitter 121 from the sampled output signal obtained from coupler 112 and produces an output signal 163. Thus, the amplitude of the F0 components of the output signal 163 is reduced relative to the amplitude of the signal 162 output from the power amplifier 105, while the amplitude of the intermodulation components remain substantially unchanged or similar to the amplitude of the signal 162 (minus any losses caused by the coupling coefficient of the coupler 112). In certain exemplary embodiments, the F0 components of the signal 163 are cancelled entirely by the noise canceller 131. In certain alternative embodiments, the amplitude of the F0 component of the signal 163 is reduced to a level similar to the amplitude of one or more of the intermodulation products of the signal 163. For example, as shown in signal 163, the fundamental tones F0 have an amplitude similar to the amplitude of the third order intermodulation products IM3.

In certain exemplary embodiments, the noise canceller 131 adjusts one of a phase, amplitude, or delay of one or both the sampled input signal and the sampled output signal prior to deducting the sampled input signal from the sampled output signal. For example, the noise canceller 131 may apply a phase adjustment or delay adjustment to one or both of the sampled input signal and the sampled output signal to temporally align the sampled input signal with the sampled output signal prior to deducting the sampled input signal from the sampled output signal. In certain exemplary embodiments, the noise canceller 131 includes an I/Q modulator that applies the phase, amplitude, and/or delay adjustment to the sampled input signal and/or sampled output signal based on an in-phase setting ("I-value") and a quadrature setting ("Q-value"). The noise canceller 131 can receive the I-value and the Q-value from a controller 150 as discussed in further detail below.

The output of the noise canceller 131 is monitored by a power detector 140. In certain exemplary embodiments, the power detector 140 includes a peak detector for measuring the overall power level of the signal 163 output by the noise canceller 131. The power detector 140 may also include or be coupled to an analog to digital converter ("A/D converter"). The A/D converter converts the power measurement to a digital format and provides the digital version of the power measurement to the controller 150.

The controller 150 is implemented in the form of a processor, microprocessor, microcontroller, computer, state machine, programmable device, or other appropriate technology. The controller 150 monitors the power measurement received from the power detector 140 and adjusts the settings of the noise canceller 131 to improve cancellation or reduction in amplitude of the fundamental tones F0 in the signal 163. For example, the controller 150 may adjust the I-value and Q-value settings of the noise canceller 131 based on the power measurement received from the power detector 140. By adjusting these settings, the controller 150 adjusts the amount of reduction in amplitude of the fundamental tones F0 in the signal 163 as well as determines the bandwidth of the cancellation. Reducing the power level of the fundamental tones F0 to a level similar to that of the intermodulation products accommodates the dynamic range of the components of the power detector 140, the noise canceller 132, and an amplifier 155, reduces insertion loss of the fundamental tones F0 in the signal 164 at the cancellation point, and avoids causing signal to noise ratio problems for high data rate modulation (e.g., 64 QAM).

The signal 163 output by the noise canceller 131 is sent to a second noise canceller 132. The noise canceller 132, along with an amplifier 155, produces a cancellation signal 170 that, when applied to the output path 199, suppresses, reduces, or cancels the intermodulation products leading to a cleaner signal 164. The noise canceller 132 and amplifier 155 produce this cancellation signal 170 by adjusting the amplitude and phase (and optionally delay) of the intermodulation products in the signal 163. The noise canceller 132 and the amplifier 155 adjust the amplitude of the intermodulation products in the cancellation signal 170 such that the amplitude of these intermodulation products in the signal 170 (minus any losses caused by the coupling coefficient of coupler 113) is equal to or close to the amplitude of the intermodulation products in the signal 162 output by the power amplifier 105. The noise canceller 132 also adjusts the phase and/or delay of the intermodulation products in the cancellation signal 170 such that the phase of the intermodulation products in the cancellation signal 170 is about 180 degrees out of phase relative to that of the intermodulation products in the signal 162 when the cancellation signal 170 is coupled to the signal 162 to generate signal 164.

In certain exemplary embodiments, the noise canceller 132 includes an I/Q modulator that applies the phase, amplitude, and/or delay adjustment to the sampled input signal and/or sampled output signal based on I-value and Q-value settings, similar to the noise canceller 131. The noise canceller 132 can receive the I-value and the Q-value from the controller 150 as discussed in further detail below.

The amplifier 155 can include one or more cascaded amplifier(s) that supplement the amplitude adjustment made by the noise canceller 132. The cancellation signal 170 is applied to the signal path of the signal 162 via a coupler 113. In certain exemplary embodiments, the coupler 113 comprises a directional coupler as illustrated in FIG. 1. As described in further detail below, the settings of the noise canceller 132 can be controlled by the controller 150 based on the amplitude of the intermodulation products remaining on signal 164 downstream from the coupler 113 after the cancellation signal 170 has been applied to the signal path.

The exemplary linearizer 101 also includes an optional third canceller 133 connected to a coupler 114. The coupler 114 samples the signal 164 resulting from the cancellation signal 170 being applied to the signal 162 and provides this sampled signal to the noise canceller 133. The noise canceller 133 also receives a sample 167 of the clean signal 161 via the splitter 121. In certain exemplary embodiments, the splitter 121 could be omitted while the inputs of canceller 131 and the 133 are tied together or otherwise electrically coupled together. As discussed above, this signal 161 comprises the fundamental tones F0 transmitted by the transmitter 103 without the intermodulation products caused by the power amplifier 105. The noise canceller 133 deducts the clean input signal 167 received from the splitter 121 from the sampled signal received from coupler 114 and feeds the resulting signal 166 to a power detector 147. Thus, the amplitude of the fundamental tones F0 in the output signal 166 is reduced relative to that of the signal 164 (minus any losses caused by the coupling coefficient of coupler 114) while the amplitude of the intermodulation components remain substantially unchanged or similar to that of the signal 164 (minus any losses caused by the coupling coefficient of coupler 114). In certain exemplary embodiments, the F0 component of the signal 166 is cancelled entirely by the noise canceller 133. In certain alternative embodiments, the amplitude of the F0 component of the signal 166 is reduced to a level similar to that of one or more of the intermodulation products of the signal 164. For example, as shown in signal 166, the fundamental tones F0 have an amplitude similar to that of the third order intermodulation products IM3.

In certain exemplary embodiments, the noise canceller 133 adjusts one of a phase, amplitude, or delay of one or both of sampled signal received from the coupler 114 and the signal 167 received from the splitter 121 prior to deducting the signal 167 from the sampled signal received from the coupler 114. For example, the noise canceller 133 may apply a phase adjustment or delay adjustment to one or both of the signal 167 and the signal received from the coupler 114 to temporally align the signal 167 with the signal received from the coupler 114 prior to deducting the signal 167 from the signal received from the coupler 114. In certain exemplary embodiments, the noise canceller 133 includes an I/Q modulator that applies the phase, amplitude, and/or delay adjustment to the signal 167 and/or signal received from the coupler 114 based on I-value and Q-value settings. The noise canceller 133 can receive the I-value and the Q-value from the controller 150. The controller 150 may adjust the I-value and Q-value settings for the noise canceller 133 based on feedback from a power detector 147.

The noise canceller 133 is an optional component in the linearizer 101. The noise canceller 133 reduces the power level of the fundamental tones F0 on the signal 166, for example to a level close to that of the intermodulation products in the signal 166. This reduces the dynamic range requirement of the power detector 147 and increases the accuracy and/or speed of the control processes of the linearizer 101. In certain exemplary embodiments, the noise canceller 133 is omitted if the dynamic ranges of the relevant stages are sufficient.

In certain exemplary embodiments, a channel filter is used in place of or in addition to the noise canceller 133 to reduce the intensity of one or more components of the sampled signal received from the coupler 114 prior to being received by the power detector 147. In certain exemplary embodiments, the sampled signal received from the coupler 114 is mixed down and filtered prior to being received from the coupler 114. That is, a mixer and filter may be used in place of or in addition to the noise canceller 133 in certain exemplary embodiments.

The signal 166 output by the noise canceller 133 is sent to the power detector 147. The power detector 147, which is described in more detail below with reference to FIG. 2, may be frequency selective and can measure the overall power of the output signal 166 provided by the signal canceller 133 or the power level of one or more of the intermodulation products and/or the fundamental tone F0 components of the signal 166, or any other component of the signal 166. The power detector 147 sends this measurement to the controller 150 and the controller 150, in turn, adjusts the settings (e.g., I-value and Q-value) of the noise canceller 132 to selectively suppress or cancel the intermodulation products from the output of the power amplifier 105, as well as determine the cancellation bandwidth. Thus, the controller 150 can dynamically control the cancellation provided by the noise canceller 132 in response to feedback provided by the power detector 147.

In certain exemplary embodiments, the power detectors 140 and 147 are implemented as a single power detector. For example, a single pole double throw switch can be included with the linearizer 101 to selectively connect either the signal 163 or the signal 166 to the input of the single power detector.

Figure 2:
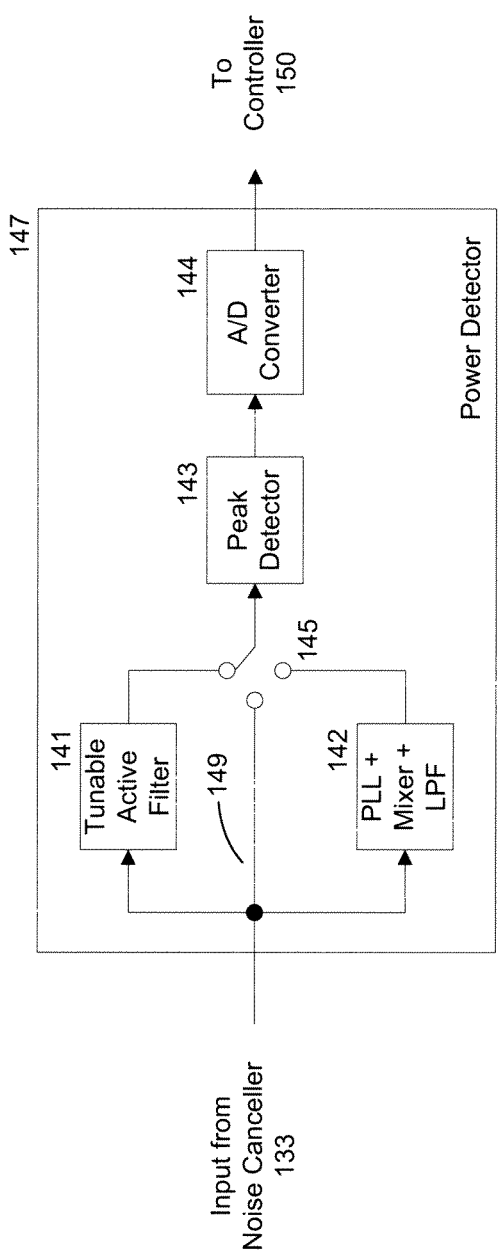
FIG. 2 is a functional block diagram depicting the power detector of FIG. 1, in accordance with certain exemplary embodiments.

FIG. 2 is a functional block diagram depicting the power detector 147 of FIG. 1, in accordance with certain exemplary embodiments. Referring to FIG. 2, the exemplary power detector 147 includes a tunable active filter 141 and/or a PLL+Mixer+LPF 142, a peak detector 143, a switch 145, a wideband feed-through path 149, and an A/D converter 144. In this exemplary embodiment, the switch 145 allows for selection between the tunable active filter 141, the PLL+Mixer+LPF 142, and a wideband feed-through path 149. In alternative exemplary embodiments, the power detector 147 includes any of the tunable active filter 141, the PLL+Mixer+LPF 142, and the wideband feed-through path 149 only.

The tunable active filter 141 applies band-pass filtering to one or more intermodulation products and/or the fundamental tones F0 contained in a signal and output those intermodulation products and/or fundamental tones F0 to the peak detector 143. The frequencies passed to the peak detector 143 by the tunable active filter 141 can be selected by the controller 150. This tunable active filter 141 allows the controller 150 to specifically monitor and change the power level of the selected intermodulation products or fundamental tones F0 being suppressed and is useful when the fundamental tones F0 have a power level similar to or lower than that of the intermodulation products. In certain exemplary embodiments, the tunable active filter 141 includes a tunable active filter similar to or substantially the same as the tunable active filter described in U.S. patent application Ser. No. 12/413,454, entitled "Filter Shaping Using a Signal-Cancellation Function," filed Mar. 27, 2009. The complete disclosure of U.S. patent application Ser. No. 12/413,454 is hereby fully incorporated herein by reference.

The PLL+Mixer+LPF 142 includes a phase-locked loop ("PLL"), a mixer, and a low pass filter ("LPF"). The PLL+Mixer+LPF 142 applies a down conversion and a channel select filter to pass a specific intermodulation product (or fundamental tone F0) of a signal to the peak detector 143. Similar to the tunable active filter 141, the specific frequencies of a signal passed to the peak detector 143 can be selected by the controller 150.

The peak detector 143 is connected to the output of the switch 145 to measure the power level of the filtered signals. Thus, the peak detector 143 measures the power level of either a single (or multiple) spectral or wideband component(s) passed to the peak detector 143. If the switch is positioned such that the feed-through path 149 is connected to the peak detector 143, the peak detector 143 measures the overall power level of the signals. If the switch 145 is positioned to connect either the tunable active filter 141 or the PLL+Mixer+LPF 142 to the peak detector 143, the peak detector 143 measures the power level of the signals passed by the tunable active filter 141 or the PLL+Mixer+LPF 142. The peak detector 143 provides the measured power level(s) to the A/D converter 144. The A/D converter 144 converts the power measurement to a digital format and provides the digital version of the power measurement to the controller 150.

Referring back to FIG. 1, the controller 150 uses the power measurement received from the power detector 147 (or power detector 140) to adjust the settings of the noise canceller 132 to improve the suppression or cancellation of the intermodulation products present on the signal 162 output by the power amplifier 105. The controller 150 adjusts the I-value and Q-value settings of the noise canceller 132 to adjust the phase, amplitude, and/or delay of the intermodulation products of the cancellation signal 170 based on the power level of the intermodulation products on the signal 164 sampled by the coupler 114. The controller 150 may execute one or more algorithms to adjust the settings of the noise canceller 132 for multiple iterations until a desired level of linearity improvement is achieved. During the execution of the algorithm(s), the controller 150 monitors power measurements received from the power detector 147 to determine preferred settings (e.g., I-value and Q-value) of the noise canceller 132. Exemplary algorithms that may be implemented by the controller 150 in certain exemplary embodiments described herein are discussed in U.S. patent application Ser. No. 13/014,681, entitled "Methods and Systems for Noise and Interference Cancellation," and filed on Jan. 26, 2011. The entire contents of U.S. patent application Ser. No. 13/014,681 is hereby fully incorporated herein by reference. The algorithms executed by the controller 150 can include one or more of a binary correction algorithm ("BCA"), a fast binary algorithm ("FBA"), a minstep algorithm ("MSA"), a blind shot algorithm ("BSA") a dual slope algorithm ("DSA"), and a track and search algorithm described in U.S. patent application Ser. No. 13/014,681. In the execution of any of the aforementioned algorithms, the controller 150 can use one or more power measurements of intermodulation product(s) received from the power detector 147 as a feedback value and apply negative polarity to identify preferred settings for the signal canceller 132.

In certain exemplary embodiments, the power detector 140 includes the same or similar components as the power detector 147. That is, in certain exemplary embodiments, the power detector 140 also includes a tunable active filter, a PLL+Mixer+LPF, and/or a bypass coupled to a peak detector. The controller 150 can select the channels or frequency components of the signal 163 passed by the tunable active filter and/or the PLL+Mixer+LPF of the power detector 140 in order to selectively measure the power level of the fundamental tones F0 of the signal 163. The controller 150 uses this power measurement to improve or refine the cancellation or suppression of the fundamental tones F0 remaining in the signal 163. For example, the controller 150 can adjust the I-value and Q-value of the noise canceller 131 based on the measured power level of the fundamental tones F0 in the signal 163 to further suppress these fundamental tones F0. In certain exemplary embodiments, the controller 150 executes an algorithm (e.g., BCA, FBA, MSA, BSA, DSA, or track and search) using the power measurements from the power detector 140 as feedback values and apply negative polarity to identify preferred settings (e.g., I-value and Q-value) for the signal canceller 131.

In certain exemplary embodiments, delay compensation for the sampling paths (e.g., couplers 111, 112, and 114) and for each cancellation path (e.g., noise cancellers 131-133) can also be employed in the linearizer 101 to improve the cancellation bandwidths and cover the full frequency range of the transmitter 103 for various communication standards. In addition or in the alternative, one or more of the noise cancellers 131-133 can include multiple noise cancellers to increase the cancellation bandwidth in the signals 163, 166, and 164. When using multiple signal cancellers, for example in a parallel arrangement, one or more algorithms illustrated in FIGS. 29-31 of U.S. patent application Ser. No. 13/014,681 may be executed by the controller 150 to determine preferred settings for the signal cancellers.

The linearizer 101 is integratable as a chip, die, or IP into any type of power amplifier 105. The linearizer 101 is implemented as a self contained integrated circuit that can be coupled to the input and output of a power amplifier 105 using couplers as described above. In certain exemplary embodiments, the linearizer 101 is included on the same integrated circuit as the power amplifier 105.

Although the linearizer 101 has been described in terms of canceling or suppressing intermodulation products introduced by a power amplifier 105, the linearizer 101 is also used to cancel or suppress mixer harmonics or noise present on the output of a transmit chain (e.g., input path 198), but not present at an input of the transmit chain. In this case, one or more of the signals coupled out of the couplers 111, 112, and 114 or into the coupler 113 may be up-converted or down-converted via mixers. In certain exemplary embodiments, the linearizer 101 is also used to cancel or suppress noise or spurs caused by IF amplifiers or mixers associated with the power amplifier signal path.

The linearizer 101 is also capable of suppressing other types of unwanted spectral components, such as spurs and/or noise present on a signal path. In addition, the linearizer 101 is capable of suppressing unwanted spectral components introduced onto the signal path by other components, such as an IF amplifier or a mixer. To reduce unwanted spectral components introduced onto the signal path by another component, the coupler 111 may be positioned at the input of that component and couplers 112-114 may be positioned along the output path of that component.

In certain exemplary embodiments, the controller 150 contains or is connected to a memory source, such as RAM, ROM, or flash memory. The memory can store preferred (e.g., temperature and band related) settings (e.g., I-value(s) and Q-value(s)) for the noise cancellers 131-133. The memory also can be used to store one or more programs or algorithms (e.g., BCA, FBA, MSA, BSA, DSA, or track and search) for use by the controller 150. In certain exemplary embodiments, the controller 150 is connected to a temperature sensor that measures the temperature proximal to the components of the linearizer 101 or the temperature of the linearizer 101.

In certain exemplary embodiments, the controller 150 communicates with external devices to receive control commands, such as a command to enable the components of the power detectors 140 and 147 or a command to select a particular channel of a tunable active filter 141 or a PLL+Mixer+LPF 142 of the power detectors 140, 147. In certain exemplary embodiments, the controller 150 provides an interface for a user to monitor the signals 161-167 and to adjust settings at the controller 150, such as selection of an algorithm or the settings for the signal cancellers 131-133. The user interface also allows a user to enable one of the components of the power detector 140, 147 or select a channel for a tunable active filter 141 or a PLL+Mixer+LPF 142. In certain exemplary embodiments, the controller 150 communicates with a host system (e.g., a receiver, wireless telephone, or base station) to determine, for example, a frequency band of operation, power level, or other parameters for use in adjusting the settings of the linearizer 101.

In certain exemplary embodiments, the linearizer 101 reduces power consumption of a power amplifier 105 by a significant amount with the output ACPR and the output power of the power amplifier 105 remaining constant. In certain exemplary embodiments, the linearizer 101 improves the ACPR of a power amplifier 105 by 20 dB or more with the bias current and the output power of the power amplifier 105 remaining constant. In certain exemplary embodiments, the linearizer 101 increases the output (and the input) power of a power amplifier 105 with the bias current and the output ACPR for the power amplifier 105 remaining constant.

Figure 3:
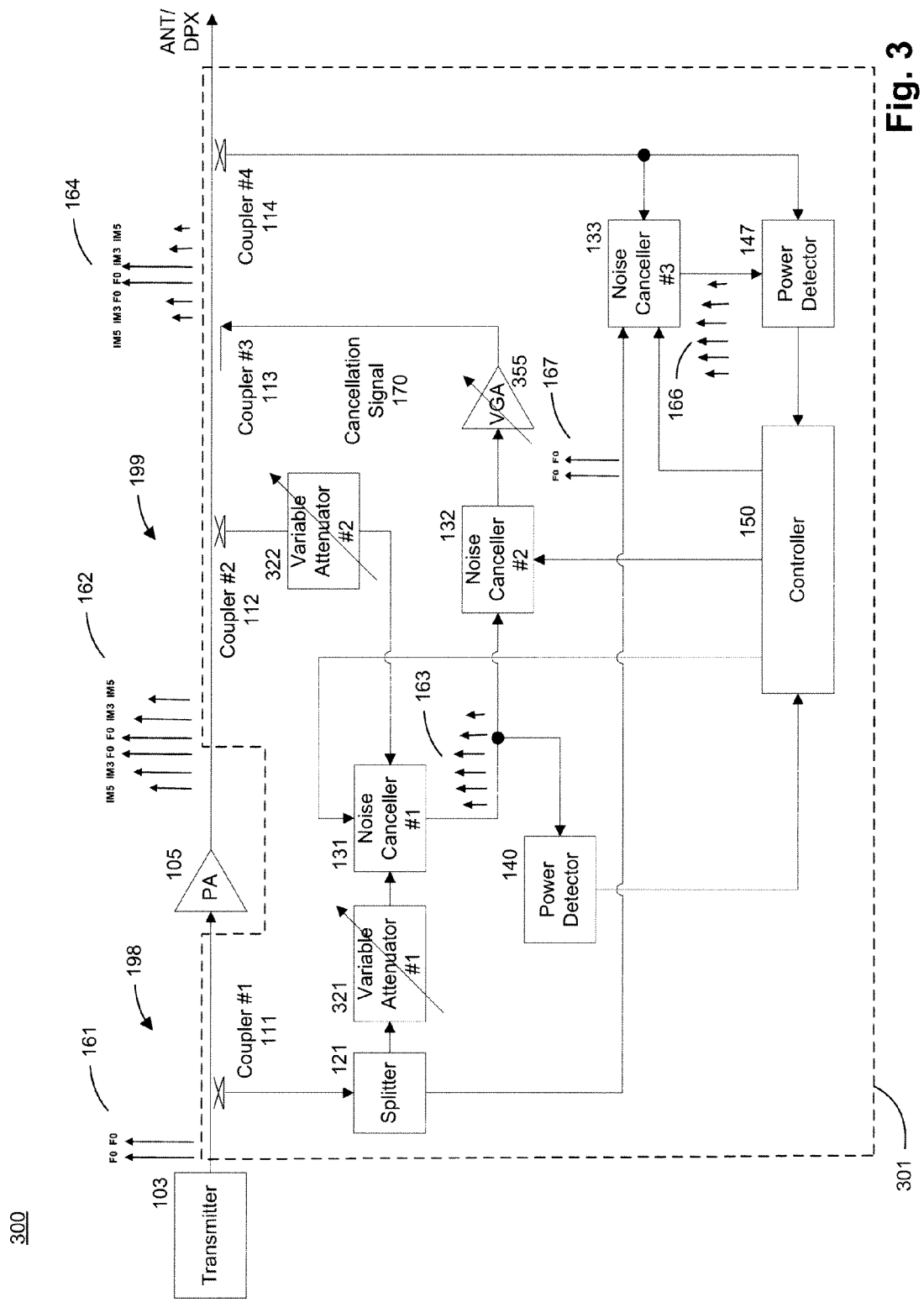
FIG. 3 is a functional block diagram of a system having a linearizer for improving the linearity of a power amplifier, in accordance with certain exemplary embodiments.

FIG. 3 is a functional block diagram depicting a system 300 having a linearizer 301 for improving the linearity of a power amplifier 105, in accordance with certain exemplary embodiments. The exemplary linearizer 301 is an alternative embodiment to the linearizer 101 illustrated in FIGS. 1 and 2 and described above. Referring to FIG. 3, the system 300 includes many of the same or similar elements to the elements of system 100. In particular, the system 300 includes a power amplifier 105 and a linearizer 301 for canceling or reducing intermodulation products generated by the power amplifier 105. The linearizer 301 includes many of the same elements of the linearizer 101, and additionally includes variable attenuators 321, 322. The linearizer 301 also includes a variable gain amplifier ("VGA") in place of the amplifier 155.

The variable attenuator 321 is disposed between coupler 111 (and optional splitter 121) and noise canceller 131. The variable attenuator 321 attenuates signals sampled by the coupler 111 to a level appropriate for the noise canceller 131. The variable attenuator 322 is disposed between coupler 112 and the noise canceller 131. The variable attenuator 322 similarly attenuates signals sampled by the coupler 112 to a level appropriate for the noise canceller 131. This attenuation by the variable attenuators 321 and 322 improves the dynamic range of the noise canceller 131. In certain exemplary embodiments, one or more of the variable attenuators 321, 322 and the VGA 355 are controlled by the controller 150.

Figure 4:
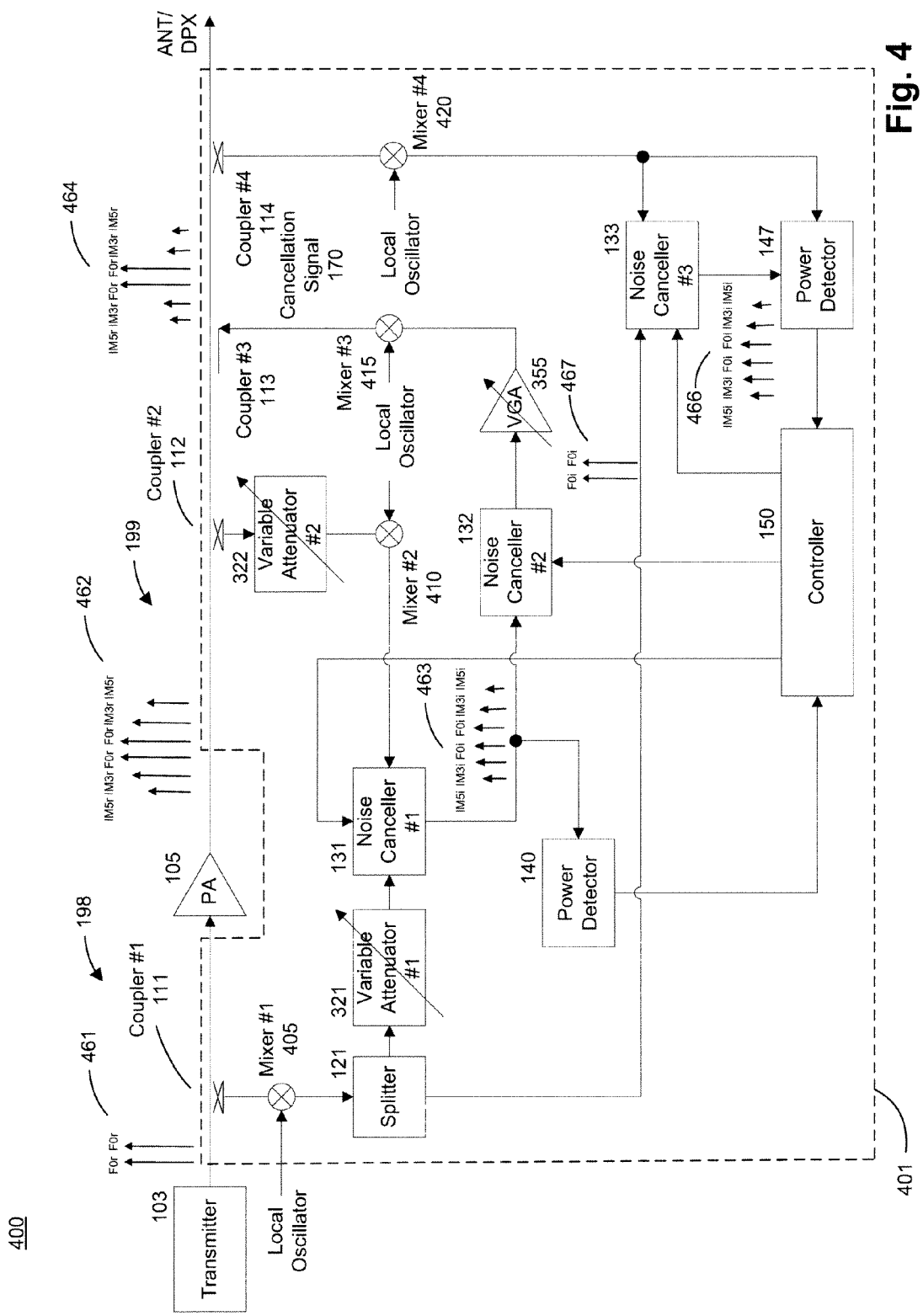
FIG. 4 is a functional block diagram of a system having a linearizer for improving the linearity of a power amplifier, in accordance with certain exemplary embodiments.

FIG. 4 is a functional block diagram depicting a system 400 having a linearizer 401 for improving the linearity of a power amplifier 105, in accordance with certain exemplary embodiments. The exemplary linearizer 401 is another alternative embodiment to the linearizer 101 illustrated in FIGS. 1 and 2 and described above. Referring to FIG. 4, the system 400 includes many of the same or similar elements to the elements of systems 100 and 300. In particular, the system 400 includes a power amplifier 105 and a linearizer 401 for canceling or reducing intermodulation products generated by the power amplifier 105. The linearizer 401 includes many of the same elements of the linearizer 301 illustrated in FIG. 3, with the addition of mixers 405, 410, 415, 420.

In this exemplary embodiment, the transmitter 103 transmits a signal 461 (e.g., via a quadrature modulator), primarily comprising fundamental tones F0$r$. The designator "$r$" indicates that the frequency of the fundamental tones F0$r$ are at radio frequency ("RF") or at any other carrier frequency. The signal 461 is sampled by coupler 111 and passed to mixer 405. The mixer 405 converts the frequency of the sampled signal by mixing the sampled signal with a local oscillator signal to produce an output signal having fundamental tones F0$i$ at an intermediate frequency ("IF").

The linearizer 401 includes a second mixer 410 that receives signals sampled at the output of the power amplifier 105 via coupler 112 (and optional variable attenuator 322). The sampled output signal includes amplified fundamental tones F0$r$ and intermodulation products (e.g., IM3$r$, IM5$r$, IM7$r$, etc.) at or near the carrier frequency. The mixer 410 converts the frequency of the sampled signal by mixing the sampled signal with a local oscillator signal to produce an output signal having fundamental tones F0$i$ and intermodulation products (e.g., IM3$i$, IM5$i$, IM7$i$, etc.) at or near the intermediate frequency.

The noise cancellers 131 and 132, optional noise canceller 133, and the associated elements function similar to the corresponding noise cancellers 131-133 and associated elements described above with reference to FIG. 1. However, the mixer 415 at the output of the VGA 355 converts the frequency of the intermodulation products present in the compensation signal (and the remaining fundamental tones) back into the carrier frequency range (e.g. F0$r$, IM3$r$, IM5$r$, IM7$r$, etc.). Also, the mixer 420 inserted between coupler 114 and optional noise canceller 133 converts the cleaned output signal into the intermediate frequency range for use in the outer loop calibration.

The addition of the mixers 405, 410, 415, and 420 increases the frequency range of the linearizer 401. In certain exemplary embodiments, the cancellation or reduction of amplitude of non-linearity components performed by the linearizer 401 occurs at high IF (e.g., from 500 MHz to 3 GHz for ultra-wideband ("UWB") power amplifiers), or at low IF (e.g., tens of MHz to a few hundred MHz). In certain exemplary embodiments, very low IF can be employed depending on delay introduced by the linearizer 401.

The attenuators 321 and 322 illustrated in the linearizer 401 are optional similar to the corresponding attenuators 321 and 322 of FIG. 3. In this exemplary embodiment, the attenuators 321 and 322 may be implemented before the mixers 405 and 410 or as a function performed by the mixers 405 and 410.

Figure 5:
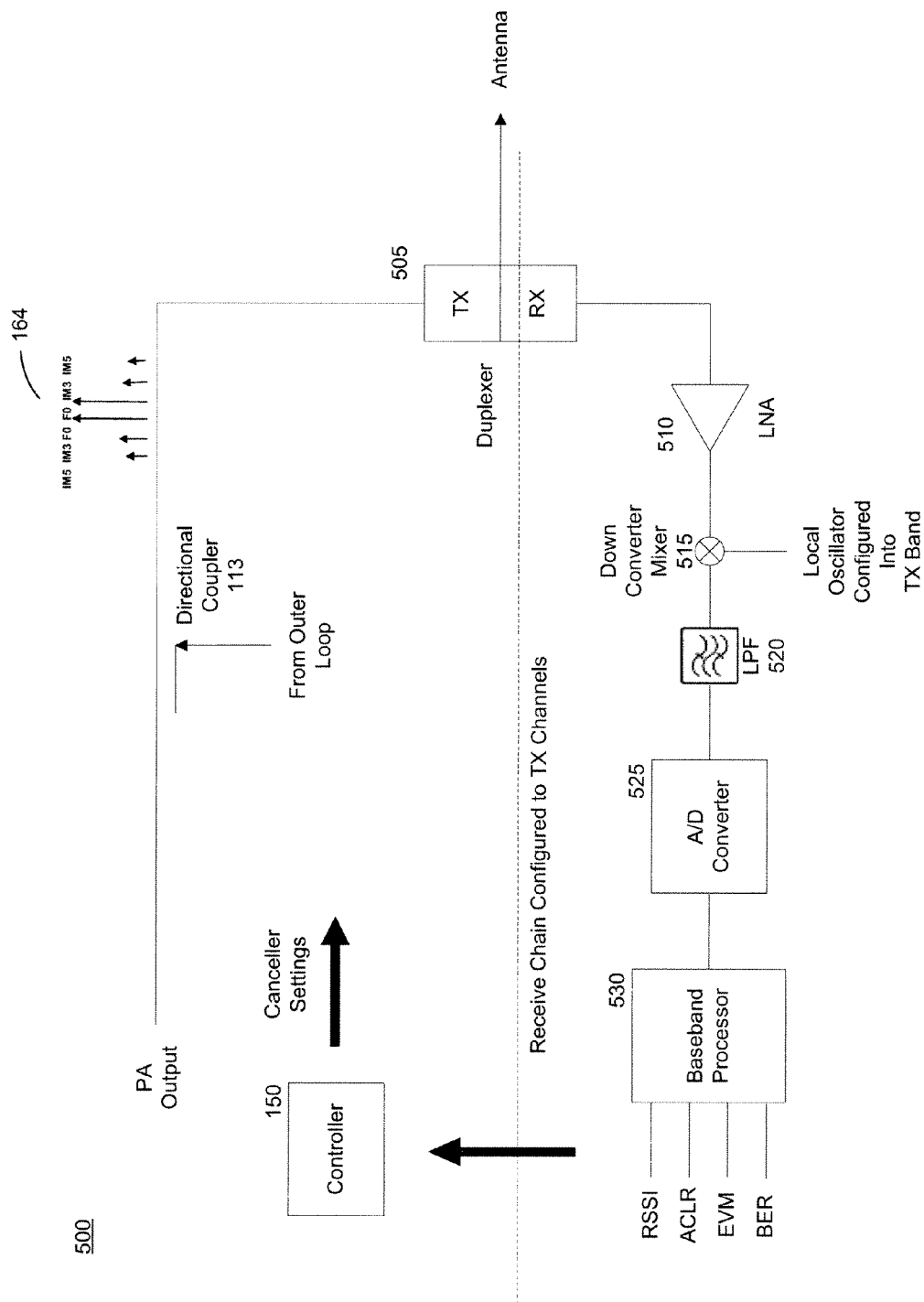
FIG. 5 is a functional block diagram depicting a method for adjusting settings of a signal canceller to improve linearity of a power amplifier, in accordance with certain exemplary embodiments.

FIG. 5 is a functional block diagram illustrating a method 500 for adjusting settings of noise canceller 132 of FIGS. 1-4 to improve the linearity of a power amplifier 105, in accordance with certain exemplary embodiments. The receiver of a base-station (or any host system where a power amplifier 105 resides, for example any handset) is configured or tuned to the transmit frequency band of the same base-station. For example, the local oscillator frequency can be tuned to the transmit band. The transmitted signals and their intermodulation products at the output of the power amplifier 105 pass through a duplexer 505 (e.g., having a transmit filter and a receive filter) before passing to a low noise amplifier ("LNA") 510 on the receive chain. The signal output by the low noise amplifier 510 gets frequency down-converted by a mixer 515 and is then filtered by a low pass filter 520 (or any intermediate band-pass filter). The filtered signal output by the filter 520 is passed to an A/D converter 525. The output of the A/D converter 525 is fed into a base band processor 530 that analyzes the transmitted signal and produces information associated with the transmitted signal. For example, this information associated with the transmitted signal can include a Receive Signal Strength Indicator ("RSSI"), Adjacent Channel Leakage Ratio ("ACLR"), Adjacent Channel Power Ratio ("ACPR"), Error Vector Magnitude ("EVM"), and/or Bit Error Rate ("BER"). This information directly corresponds to the linearity of the power amplifier 105. The base band processor 530 passes the information on to the controller 150 which then adjusts I and Q settings (I-value and Q-value) for the noise canceller 132 based on an algorithm (e.g., BCA, FBA, MSA, BSA, DSA, or track and search) and the information associated with the transmitted signal. Thus the controller 150 can execute one or more of the algorithms using RSSI, ACLR, ACPR, EVM, and/or BER as a feedback value.

In this exemplary embodiment, the transmitted signal could either be a modulated signal of specific communication channels of the transmitter (e.g., 64QAM occupying a 5 MHz channel, multiple carriers occupying adjacent or alternative channels) or two single tones locates at the upper, middle, or lower part of the communication band being used by the transmitter 103. The local oscillator frequency for the downconversion can be adjusted accordingly to allow the desired transmitted signals (including intermodulation products) to pass on to the base band processor 530 for measurements of EVM, and/or BER, and/or RSSI, or to allow the intermodulation products to pass on to the base band processor 530 for ACLR measurement. Because the attenuation of the TX-RX isolation of the duplexer 505 is frequency dependent, it is optional to measure and store (e.g., in the base band processor 530) the TX or RX transfer function of the duplexer 505 as a calibration reference.

Figure 6:
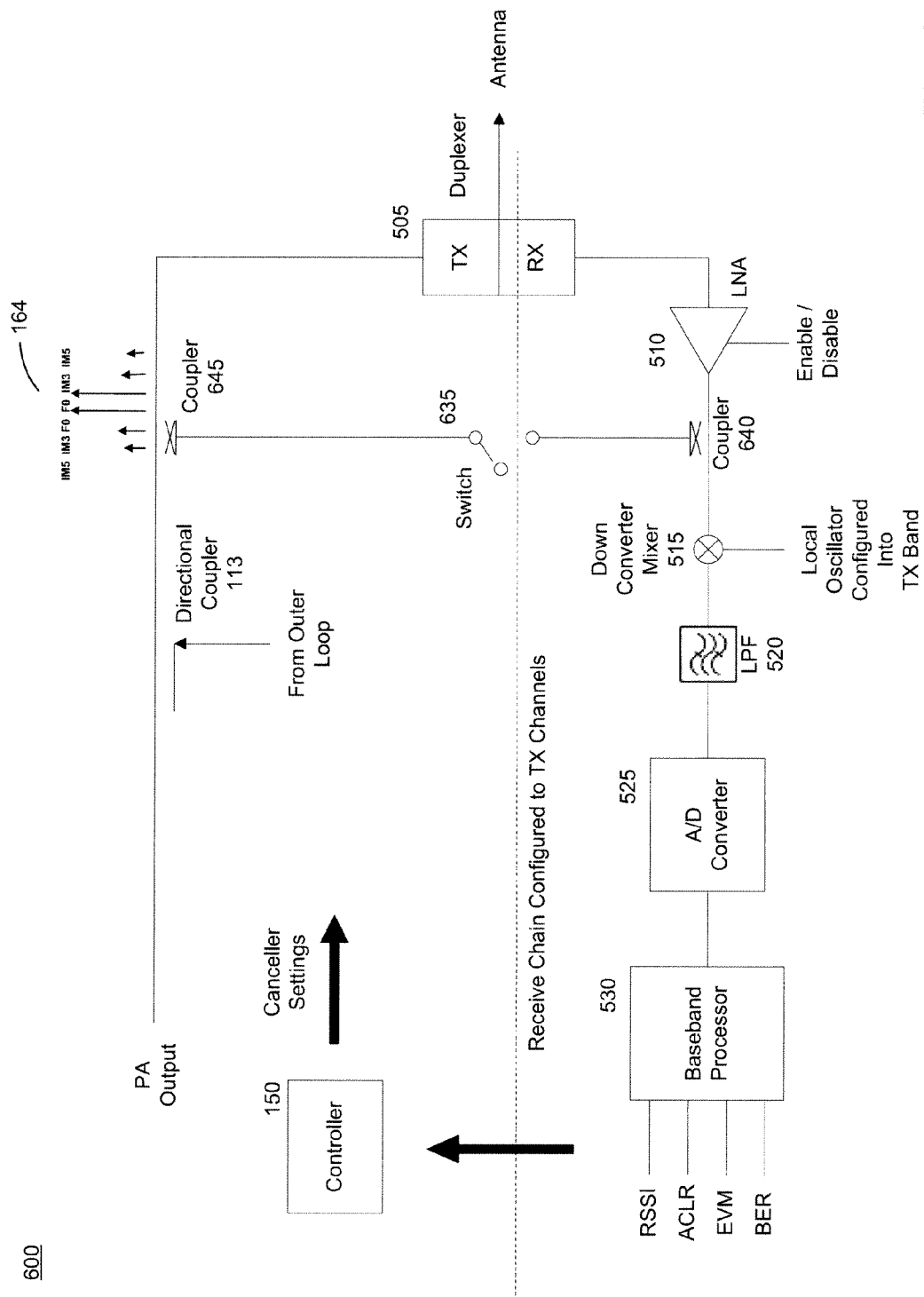
FIG. 6 is a functional block diagram depicting a method for adjusting settings of a signal canceller to improve linearity of a power amplifier, in accordance with certain exemplary embodiments.

FIG. 6 is a functional block diagram illustrating a method 600 for adjusting settings of noise canceller 132 of FIGS. 1-4 to improve the linearity of a power amplifier 105, in accordance with certain alternative exemplary embodiments. In this exemplary embodiment, a signal output by the power amplifier 105 (including fundamental tones and intermodulation products) is sampled by a coupler 645. This sampled output signal is passed through a switch 635 and is coupled onto the receive chain via coupler 640 during calibration of the outer loop. During normal operation of the receive chain, the switch 635 disconnects coupler 640 from coupler 645. In certain exemplary embodiments, the location of the coupler 640 can be at the output of the LNA 510 as shown, or at the input of the LNA 510. The LNA 510 may optionally be disabled in embodiments having the coupler 640 located at the output of the LNA 510 to isolate the sampled PA output spectrum from signals received from the antenna and/or noise generated by the LNA 510.

The local oscillator of the receiver can be configured to tune to the transmit band of the transmitter. The transmitted signal and the intermodulation products may be passed on to the base band processor 530 after being passed through the filter 520 and the A/D converter 525. As described above with reference to FIG. 5, the base band processor 530 measures the RSSI, ACLR, EVM, and/or BER and provides these measurements to the controller 150. The controller 150 uses these measurements as a feedback value during the execution of one or more algorithms (e.g., BCA, FBA, MSA, BSA, DSA, or track and search). Compared to the method 500, this exemplary method 600 bypasses the duplexer 505 and its frequency dependent TX-RX isolation would not affect the calibration of the outer loop (e.g., noise canceller 132 loop). Also, by optionally disabling the LNA 510, the impact of the received TX signals via antenna (e.g., from a nearby basestation head or the phase noise portion of RX signals in TX band) would be eliminated as well.

Figure 7:
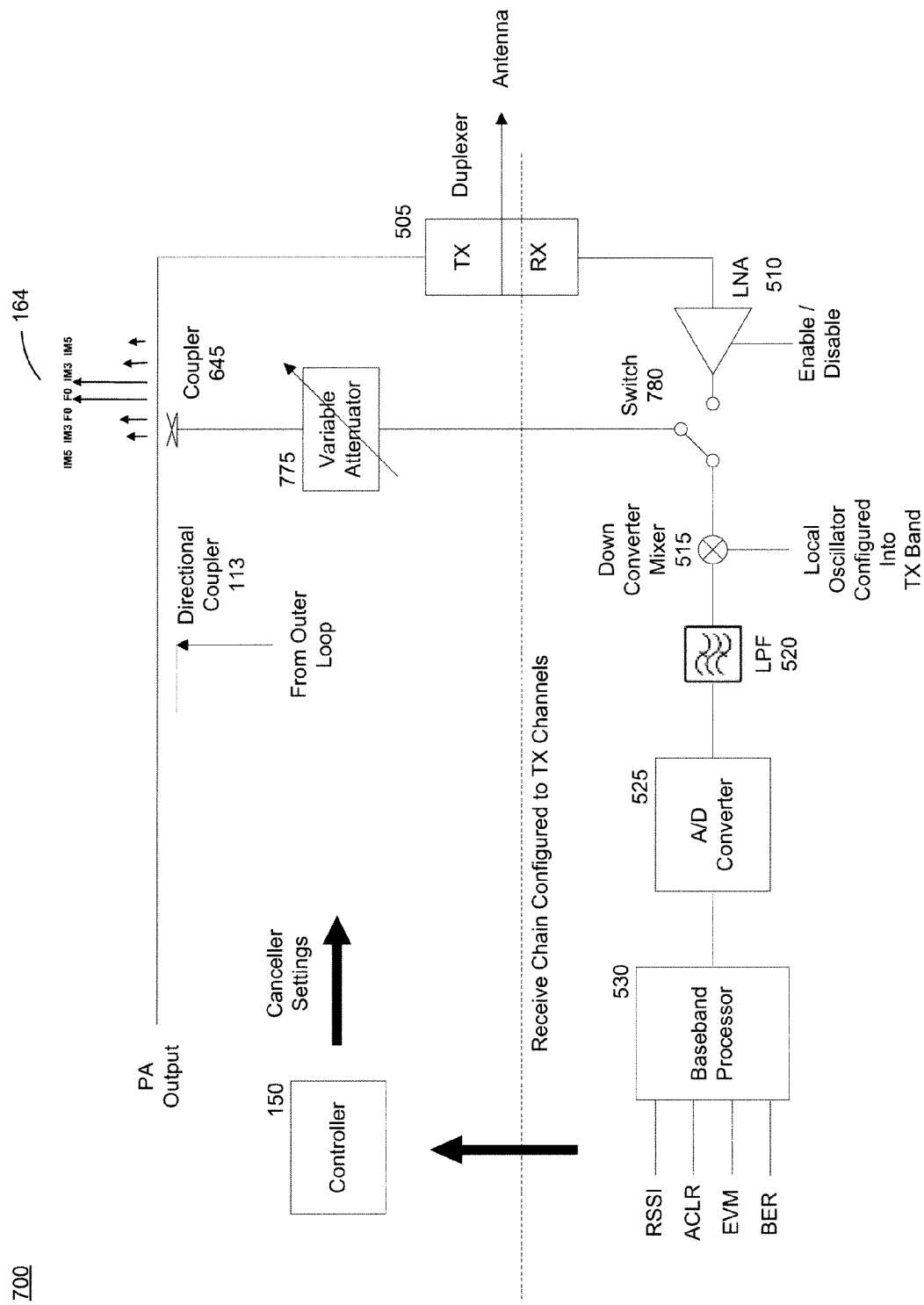
FIG. 7 is a functional block diagram depicting a method for adjusting settings of a signal canceller to improve linearity of a power amplifier, in accordance with certain exemplary embodiments.

FIG. 7 is a functional block diagram illustrating a method 700 for adjusting settings of noise canceller 132 of FIGS. 1-4 to improve the linearity of a power amplifier 105, in accordance with certain alternative exemplary embodiments. This exemplary method 700 is similar to the method 600 illustrated in FIG. 6. However, the switch 635 and the coupler 640 are replaced with a single pole double throw ("SPDT") switch 780 connected between the input of the local oscillator, the output of the LNA 510, and the sampling path leading to coupler 645. In this exemplary embodiment, an optional variable attenuator 775 is also inserted on the sampling path between the coupler 645 and the switch 780 for attenuating signals transmitted by the transmitter 103 so that the signals do not exceed the linearity criteria of the mixer 515.

During normal operation of the receive chain, the switch 780 is connected between the input of the mixer 515 and the output of the LNA 510. During calibration of the noise canceller 132, the switch 780 is connected between the input of the mixer and the sampling path. The sampled transmit signal and the intermodulation products at the output of the power amplifier 105 are passed to the mixer 515 for frequency conversion, followed by RSSI, ACLR, EVM, and/or BER measurement through the base band processor 530. These measurements are passed to the controller 150 and the controller 150 adjusts the settings (e.g., I-value and Q-value) of the canceller 132 based on the measurements and/or one or more algorithms (e.g., BCA, FBA, MSA, BSA, DSA, or track and search).

Figure 8:
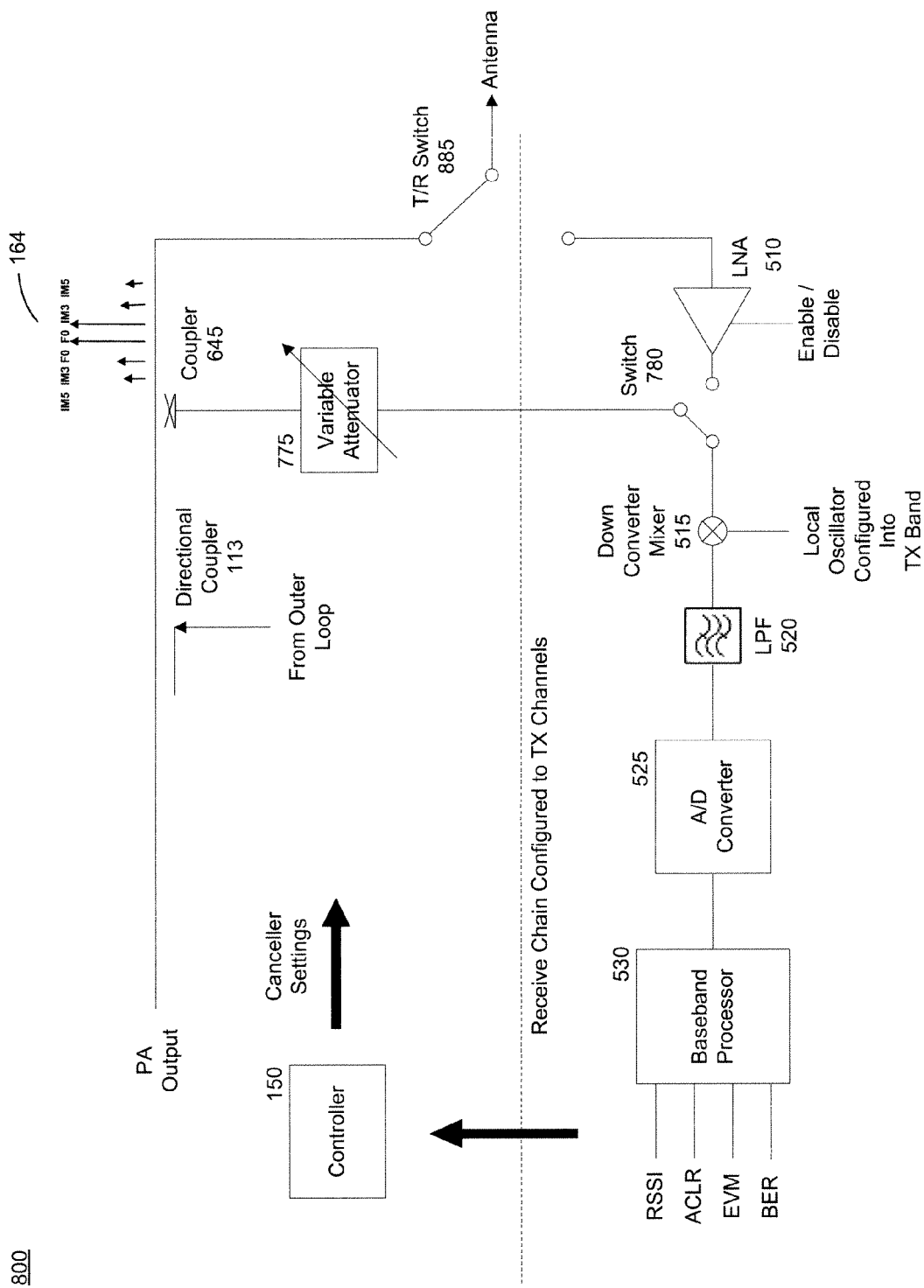
FIG. 8 is a functional block diagram depicting a method for adjusting settings of a signal canceller to improve linearity of a power amplifier, in accordance with certain exemplary embodiments.

FIG. 8 is a functional block diagram illustrating a method 800 for adjusting settings of noise canceller 132 to improve the linearity of a power amplifier 105, in accordance with certain alternative exemplary embodiments. The exemplary method 800 is similar to the methods 600 and 700 illustrated in FIGS. 6 and 7, respectively. However, the duplexer 505 is replaced with a transmit/receive ("T/R") switch 885. The T/R switch 885 is typically used for time domain multiplexing in a base-station (e.g., for Time Division Synchronous Code Division Multiple Access ("TD-SCMA"), and is implemented in many handsets.

During the calibration of the noise canceller 132, the T/R switch 885 connects the output of power amplifier 105 to the antenna, while the LNA 510 in the receive chain could be optionally turned off to eliminate the impact of its noise floor. The switch 780 connects the sampling path to the mixer 515. The sampled transmit signals and their intermodulation products, optionally attenuated by the variable attenuator 775, would be passed on to the mixer 515 for frequency conversion. The sampled signal is then measured for RSSI, ACLR, EVM, and/or BER measurement by the base band processor 530. These measurements are passed to the controller 150 and the controller 150 adjusts the settings of the canceller 132 based on the measurements and/or one or more algorithms (e.g., BCA, FBA, MSA, BSA, DSA, or track and search).

Figure 9:
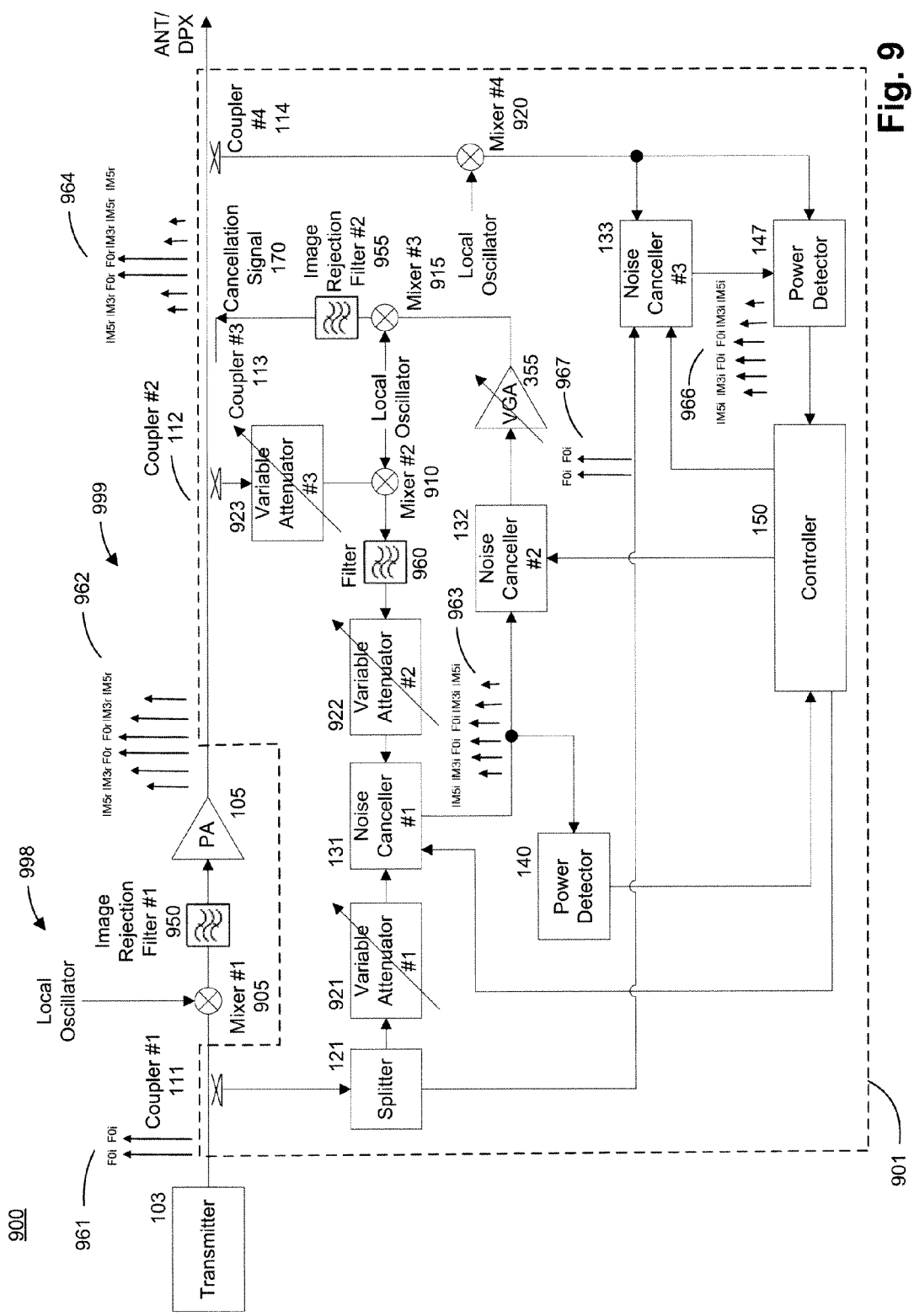
FIG. 9 is a functional block diagram of a system having a linearizer for improving the linearity of a power amplifier, in accordance with certain exemplary embodiments.

FIG. 9 is a functional block diagram depicting a system 900 having a linearizer 901 for improving the linearity of a power amplifier 105, in accordance with certain exemplary embodiments. The linearizer 901 is another alternative embodiment to the linearizer 101 illustrated in FIGS. 1 and 2 and described above. Referring to FIG. 9, the system 900 is similar to the system 400 of FIG. 4, with the exception that the mixer 905 at the input of the power amplifier 105 is disposed along the signal path of the power amplifier 105 rather than in the signal path of the cancellers 131 and 133.

The exemplary linearizer 901 includes an optional image rejection filter 950 at the output of the mixer 905 for rejecting any images produced by the mixer 905. This filter 950 also can reduce the impact of mixer feed-through to the power amplifier 105. Depending on the frequency plan of the transmitter 103, the filter 950 may take the form of a high-pass filter ($f_{PA} > f_{LO}$), low pass filter ($f_{PA} < f_{LO}$), or a band-pass filter with $f_{PA}$ located at the center of its pass-band.

The linearizer 901 also includes an image rejection filter 955 in the outer loop for rejecting images produced by mixer 915. An additional filter 960 in the inner loop of the linearizer provides additional rejection of mixer leakage from the mixer 910.

Figure 10:
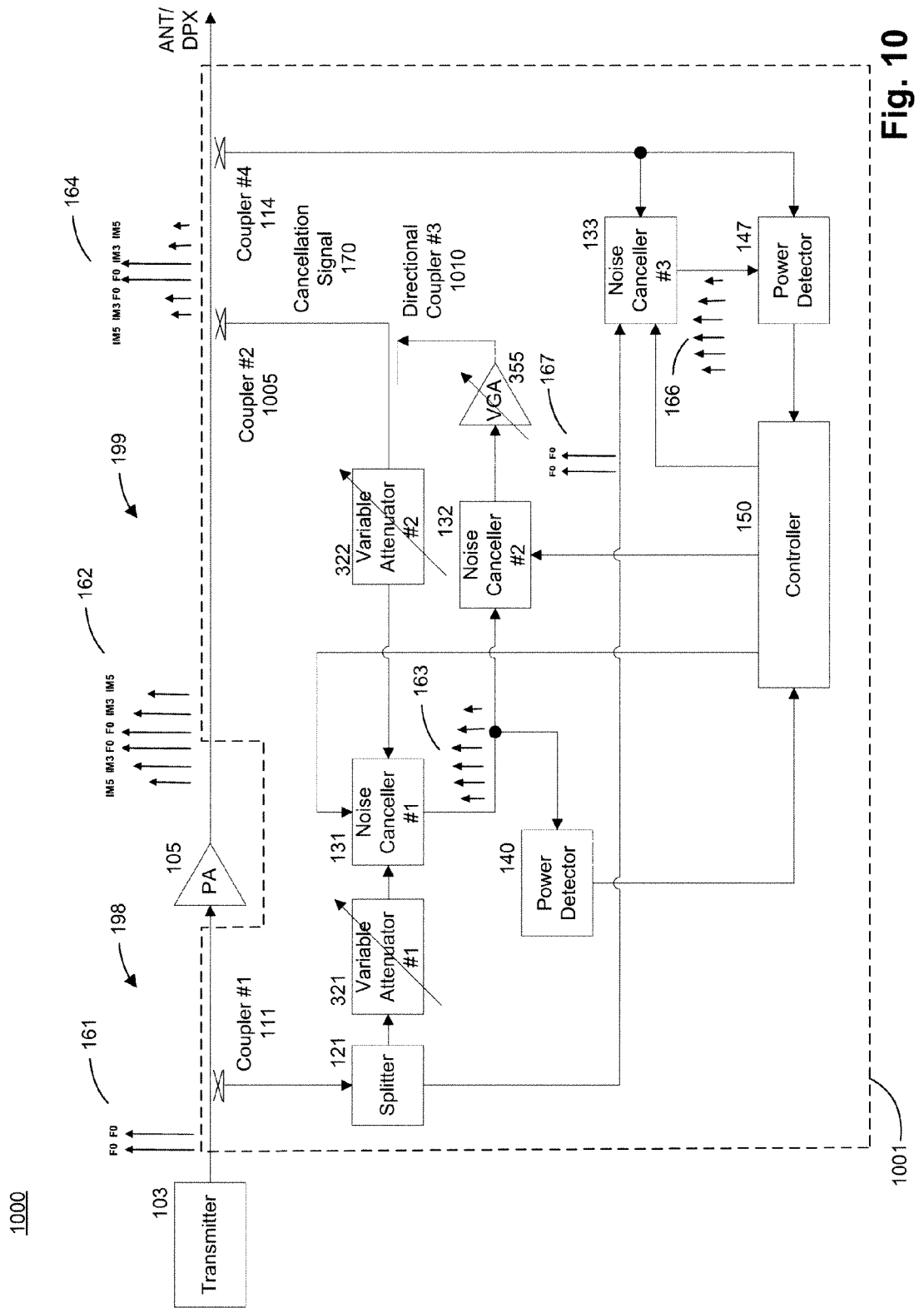
FIG. 10 is a functional block diagram of a system having a linearizer for improving the linearity of a power amplifier, in accordance with certain exemplary embodiments.

FIG. 10 is a functional block diagram depicting a system 1000 having a linearizer 1001 for improving the linearity of a power amplifier 105, in accordance with certain exemplary embodiments. The linearizer 1001 is another alternative embodiment to the linearizer 101 illustrated in FIGS. 1 and 2 and described above. Referring to FIG. 10, the exemplary linearizer 1001 differs from the linearizer 101 in that the linearizer 1001 includes a directional coupler 1010 at the PA output side of the input of the inner loop (e.g., at the input of optional variable attenuator 322) that eliminates one coupler (e.g., coupler 112 of FIG. 1) at the output of the power amplifier 105. The advantage of this embodiment is that it reduces insertion loss in the power amplifier output path 199 caused by the eliminated one coupler.

In this exemplary embodiment, the directivity of the directional coupler 1010 is typically greater than the summation of the total gain of variable attenuator 322, noise canceller 132, VGA 355, and coupling coefficient of directional coupler 1010 to ensure stability of the loop around noise canceller 132. In this exemplary embodiment, the couplers 1005, 1010 are both shared for both sampling and cancellation.

Figure 11:
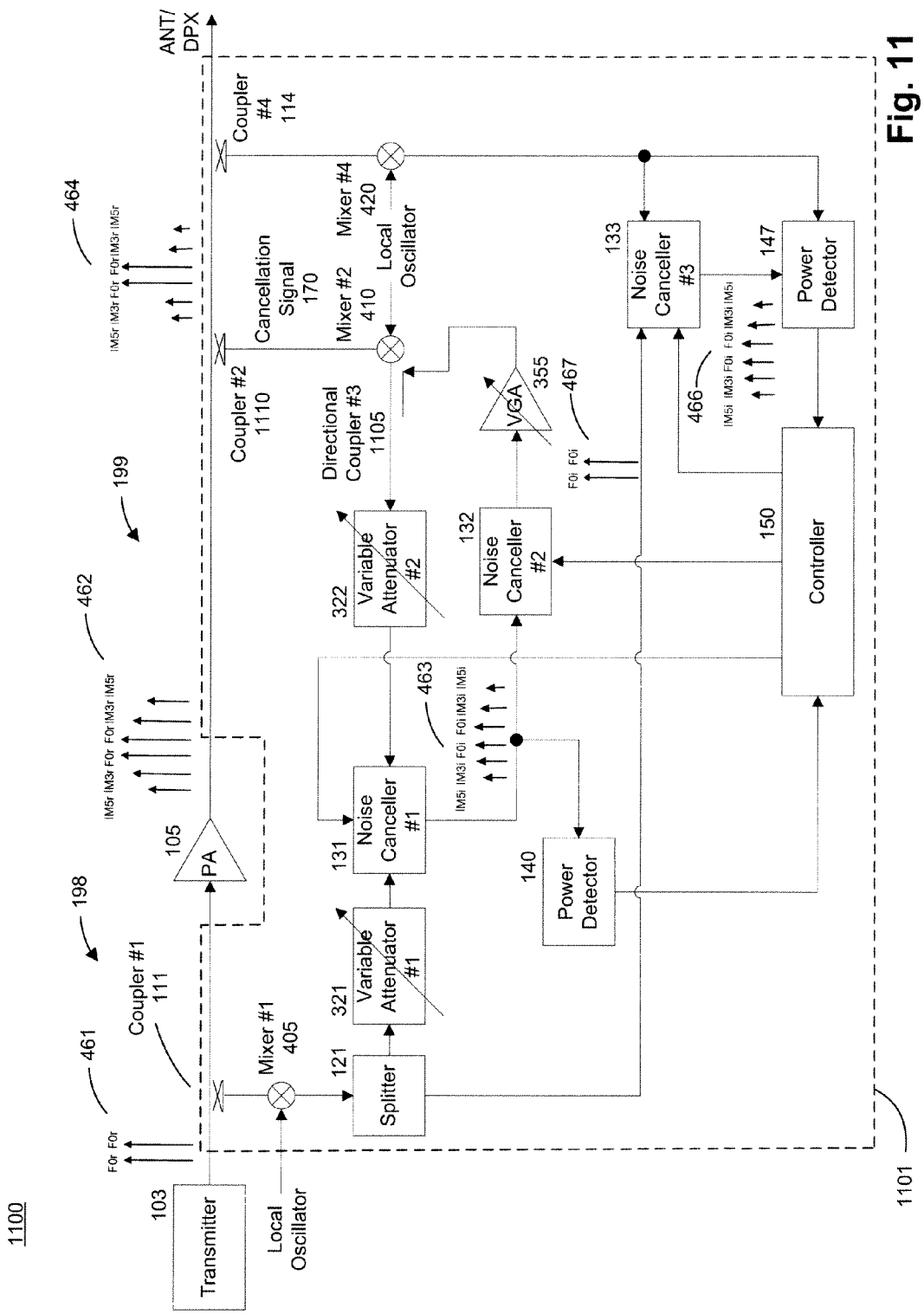
FIG. 11 is a functional block diagram of a system having a linearizer for improving the linearity of a power amplifier, in accordance with certain exemplary embodiments.

FIG. 11 is a functional block diagram depicting a system 1100 having a linearizer 1101 for improving the linearity of a power amplifier 105, in accordance with certain exemplary embodiments. The linearizer 1101 is another alternative embodiment to the linearizer 101 illustrated in FIGS. 1 and 2 and is particularly similar to the linearizer 401 of FIG. 4. Referring to FIG. 11, the linearizer 1101 differs from the linearizer 401 in that the linearizer 1101 includes a directional coupler 1105 between the mixer 410 and the input of optional variable attenuator 322 that eliminates one coupler (e.g., coupler 112 of FIG. 4) at the output of the power amplifier 105. The advantage of this embodiment is that it reduces insertion loss in the power amplifier output path 199.

In this exemplary embodiment, the directivity of the directional coupler 1105 is typically greater than the summation of the total gain of variable attenuator 322, noise canceller 132, VGA 355, and coupling coefficient of directional coupler 1105 to ensure stability of the loop around noise canceller 132. In this exemplary embodiment, the couplers 1105, 1110 are both shared for both sampling and cancellation.

Figure 12:
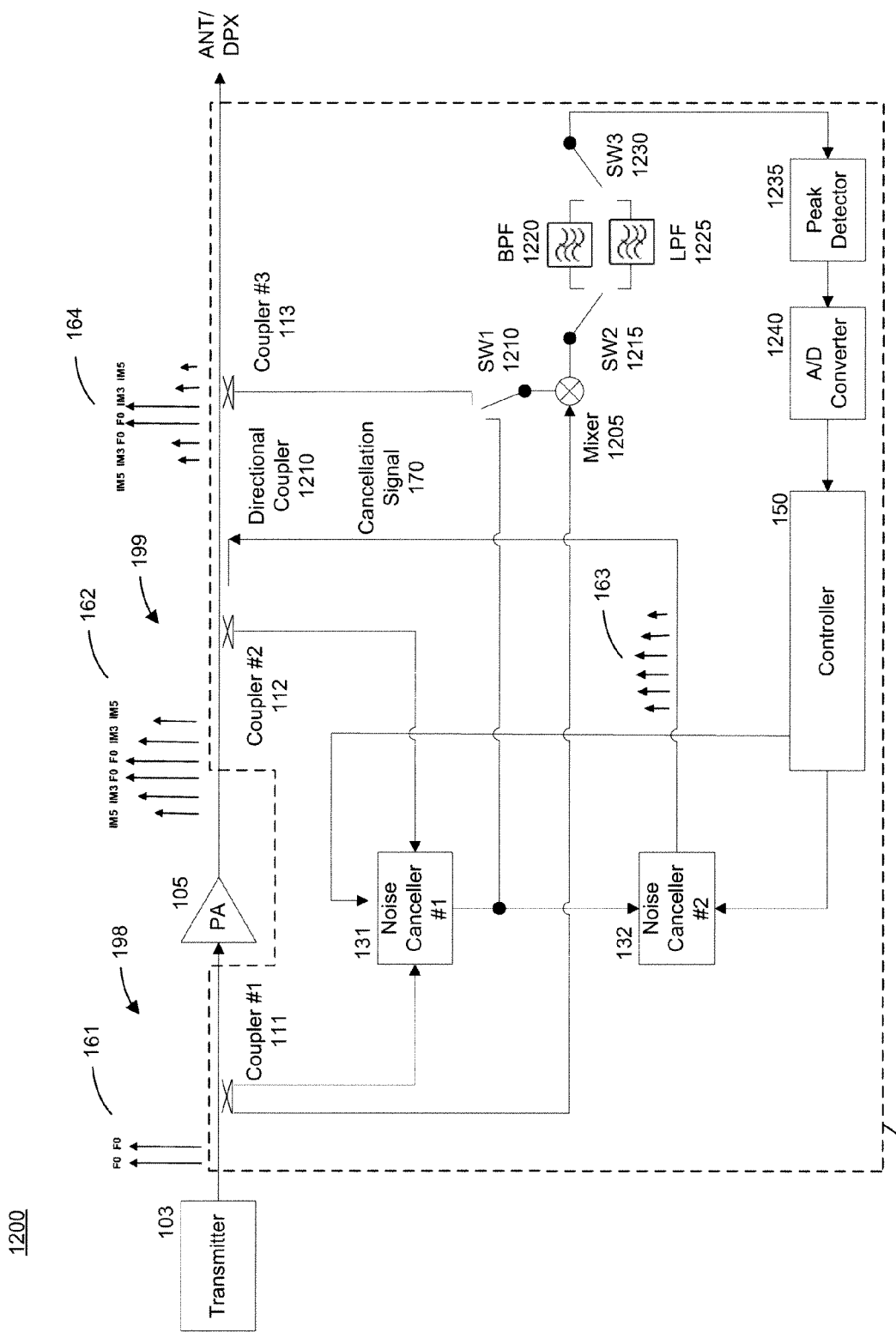
FIG. 12 is a functional block diagram of a system having a linearizer for improving the linearity of a power amplifier, in accordance with certain exemplary embodiments.

FIG. 12 is a functional block diagram depicting a system 1200 having a linearizer 1201 for improving the linearity of a power amplifier 105, in accordance with certain exemplary embodiments. The linearizer 1201 is another alternative embodiment to the linearizer 101 illustrated in FIGS. 1 and 2 and is particularly similar to the linearizer 101 of FIG. 1. Referring to FIG. 12, the exemplary linearizer 1201 includes a mixer 1205, a band-pass filter 1220, and a low-pass filter 1225 in addition to the components of the linearizer 101. The input of the mixer 1205 receives samples of signals transmitted by the transmitter 103 via coupler 111, a sample of a signal downstream from where the cancellation signal is applied via coupler 113 and a switch 1210, or a signal output by noise canceller 131 via switch 1210.

By adding the mixer 1205 and the filters 1220 and 1225 in this arrangement, the controller 150 can monitor the power level (via peak detector 1235 and A/D converter 1240) of fundamental tones F0 sampled at the output of noise canceller 131 for adjusting the inner loop (e.g., noise canceller 131) as well as the power level of the IM products for adjusting the outer loop (e.g., noise canceller 132) sampled via coupler 113. In certain exemplary embodiments, the band-pass filter 1220 has a pass-band frequency between the communication bandwidth (or channel) being transmitted by the transmitter ("fc") and 2*fc (e.g., 25 MHz to 50 MHz for UMTS850 base-station). In certain exemplary embodiments, the band-pass filter 1220 has a pass-band frequency between 2*fc and 3*fc (e.g., 50 MHz to 75 MHz for UMTS850). In certain exemplary embodiments, the low-pass filter 1225 has a bandwidth of the total channel bandwidth fc of the communication signal being transmitted by the transmitter (e.g., 25 MHz for an exemplary UMTS850 embodiment).

Switches 1210, 1215, and 1230 are operated by the controller 150 to select which signal to monitor. In particular, when switch 1210 is connected between the mixer 1205 (e.g., RF port) and the output of canceller 131, switch 1215 is connected between the mixer 1205 (e.g., IF port) and the input of the low-pass filter 1225, and switch 1230 is connected between the output of the low-pass filter 1225 and the peak detector 1235 input. The peak detector output indicates the carrier fundamental tones F0 power level for the inner loop adjustment. Similarly, when switch 1210 is connected between the mixer 1205 (e.g., RF port) and coupler 113, switch 1215 is connected between the mixer 1205 (e.g., IF port) and the input of the band-pass filter 1220, and switch 1230 is connected between the output of the band-pass filter 1220 and the peak detector 1235 input. The peak detector output indicates the intermodulation products power level for the outer loop adjustment. In certain exemplary embodiments, this calibration is implemented on the same chip as the power amplifier linearizer 1201 and ensures continuous operation of calibration and measurement without base-station involvement.

In yet another embodiment, the band pass filter 1220 could have only a fraction of the bandwidth, e.g. 1 MHz, and an adjustable center frequency allowing it to be located at, e.g. fc, 1.5*fc, 2*fc, 2.5*fc, and 3*fc. The controller 150 selects the center frequency of this band-pass filter based on an algorithm, for example scanning across the transmit band, while the peak detector outputs the intermodulation products power level within that bandwidth. The controller 150 then combines those measurements to calculate an average value for the power level of the intermodulation products across the entire communication bandwidth and adjusts the settings (e.g., I-value and Q-value) of the outer loop (e.g., the path of noise canceller 132) if appropriate.

In certain exemplary embodiments, the switch 1210 and/or the switch 1230 are replaced with a combiner, splitter, or current summing device. In certain exemplary embodiments, the peak detector 1235, the LPF 1225, the BPF 1220, the switches 1215, 1230 are omitted from the linearizer 1201. In such an embodiment, the output signal of the mixer 1205 is directly converted into a digital signal by the ADC 1240 for the controller 150 to use digital signal processing techniques to extract the power level of either the intermodulation products or the fundamental tones.

Figure 13:
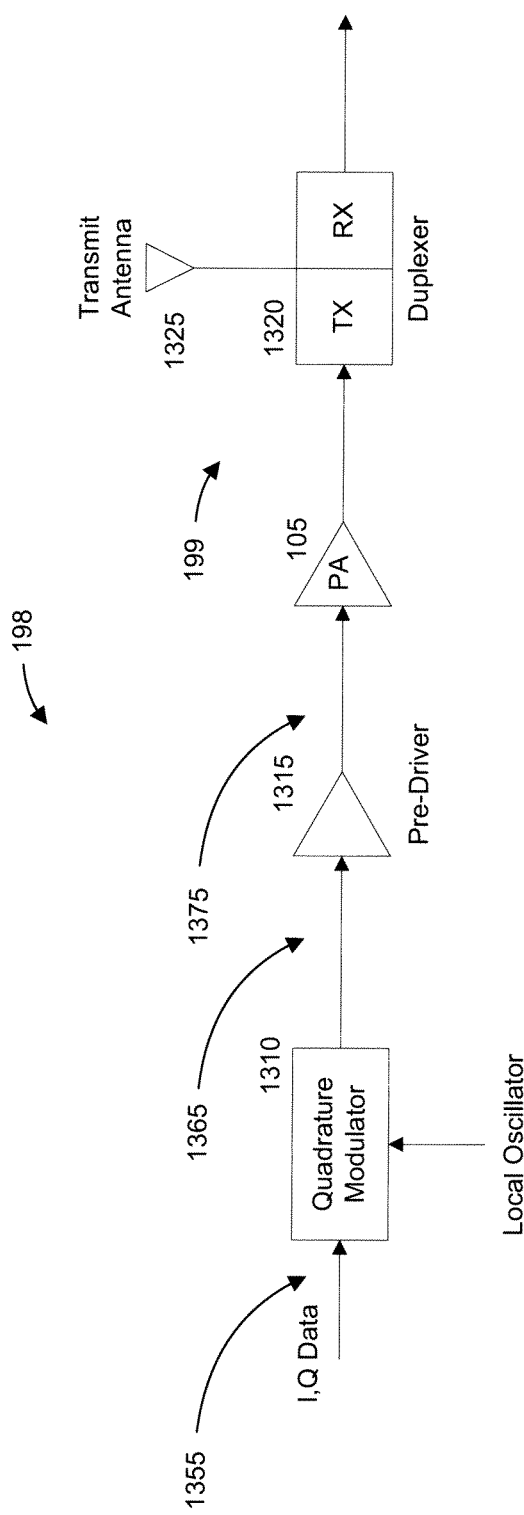
FIG. 13 is a functional block diagram of a transmit path of a power amplifier, in accordance with certain exemplary embodiments.

FIG. 13 is a block diagram depicting an exemplary transmit path 1300 of the power amplifier 105 of any of the foregoing FIGS. 1-12. Referring to FIG. 13, the transmit path 1300 includes the input path 198 and the output path 199. The input path includes a quadrature modulator 1310 and a pre-driver 1315. The output path 199 includes a transmit antenna 1325 coupled to a duplexer 1320. This figure is provided to illustrate additional locations along the transmit path 1300 where a sample of the fundamental tones F0 of a signal transmitted by the transmitter 103 may be obtained. For example, the sample of the fundamental tones F0 may be obtained at point 1355 at the input of the quadrature modulator 1310, at point 1365 at the input of the pre-driver 1315, at point 1375 at the input of the power amplifier 105.

The exemplary methods and acts described in the embodiments presented previously are illustrative, and, in alternative embodiments, certain acts can be performed in a different order, in parallel with one another, omitted entirely, and/or combined between different exemplary embodiments, and/or certain additional acts can be performed, without departing from the scope and spirit of the invention. Accordingly, such alternative embodiments are included in the invention described herein.

The invention can be used with computer hardware and software that performs the methods and processing functions described above. As will be appreciated by those skilled in the art, the systems, methods, and procedures described herein can be embodied in a programmable computer, computer executable software, or digital circuitry. The software can be stored on computer readable media. For example, computer readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays ("FPGA"), etc.

Although specific embodiments of the invention have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the invention defined in the following claim(s), the scope of which is to be accorded the broadest interpretation so as to encompass such modifications and equivalent structures.

What is claimed is:

1. A method for improving linearity of a power amplifier, comprising the steps of:
   obtaining a first sample from an input signal path of the power amplifier;
   obtaining a second sample and a third sample from an output signal path of the power amplifier; and
   producing an output, that improves linearity when applied to the output signal path, by:
      with a first canceller that comprises a first setting, producing a signal responsive to deducting the first sample from the second sample, the signal comprising a component;
      with a second canceller, adjusting amplitude, phase, and delay of the component according to a second setting;
      adjusting the first setting based on intensity of a spectral component of the signal; and
      adjusting the second setting based on intensity of a non-linearity component of the third sample.

2. The method of claim 1, wherein the second sample is obtained from a first location on the output signal path,
   wherein the third sample is obtained from a second location on the output signal path, and
   wherein the output is applied to the output signal path at a third location that is disposed between the first location and the second location.

3. The method of claim 2, wherein the second location is downstream from the first location.

4. The method of claim 1, wherein the second setting comprises a control setting.

5. A method for improving linearity of a power amplifier, comprising the steps of:
   obtaining a first sample from an input signal path of the power amplifier;
   obtaining a second sample and a third sample from an output signal path of the power amplifier; and
   producing an output, that improves linearity when applied to the output signal path, by:
      with a first canceller that comprises a first setting, producing a signal responsive to deducting the first sample from the second sample, the signal comprising a component;
      with a second canceller, adjusting amplitude, phase, or delay of the component according to a second setting;
      adjusting the first setting based on intensity of a spectral component of the signal; and
      adjusting the second setting based on intensity of a non-linearity component of the third sample,
   wherein the second setting comprises an in-phase setting and a quadrature setting.

6. A method for improving linearity of a power amplifier, comprising the steps of:
   obtaining a first sample from an input signal path of the power amplifier;
   obtaining a second sample and a third sample from an output signal path of the power amplifier; and
   producing an output, that improves linearity when applied to the output signal path, by:
      with a first canceller that comprises a first setting, producing a signal responsive to deducting the first sample from the second sample, the signal comprising a component;
      with a second canceller, adjusting amplitude, phase, or delay of the component according to a second setting;
      adjusting the first setting based on intensity of a spectral component of the signal; and
      adjusting the second setting based on intensity of a non-linearity component of the third sample,
   further comprising reducing intensity of a spectral component of the third sample by mixing down and filtering components of the third sample having a frequency at or near baseband of the power amplifier.

7. A method for improving linearity of a power amplifier, comprising the steps of:
   on a first input, receiving a first sample from an input signal path of the power amplifier;
   on a second input, receiving a second sample from an output signal path of the power amplifier
   on a third input, receiving a third sample from an output signal path of the power amplifier; and
   producing an output, that improves linearity when applied to the output signal path, by:
      producing a signal responsive to deducting the first sample from the second sample, the signal comprising a component;
      with a canceller, adjusting amplitude, phase, or delay of the component according to a control setting; and adjusting the control setting based on intensity of a spectral component of the third sample,
wherein a frequency converting mixer is disposed between the first input and the canceller or between the canceller and a path that carries the produced output.

8. The method of claim 7, wherein the frequency converting mixer is disposed between the first input and the canceller.

9. The method of claim 7, wherein the frequency converting mixer is disposed between the canceller and the path that carries the produced output.

10. The method of claim 7, wherein adjusting amplitude, phase, or delay of the component according to the control setting comprises adjusting the amplitude.

11. The method of claim 7, wherein adjusting amplitude, phase, or delay of the component according to the control setting comprises adjusting the phase.

12. The method of claim 7, wherein adjusting amplitude, phase, or delay of the component according to the control setting comprises adjusting the delay.

13. The method of claim 7, further comprising reducing intensity of a spectral component of the third sample by mixing down and filtering components of the third sample having a frequency at or near baseband of the power amplifier.

14. A system, comprising:
a signal transmit path comprising an amplifier;
a first input configured to receive a first sample comprising an input signal to the amplifier;
a second input configured to receive a second sample comprising an amplifier output signal from the amplifier;
an output configured to feed a linearity improving signal to the amplifier output signal;
a third input configured to receive a third sample comprising the amplifier output signal from a location along an amplifier output signal path; and
a linearization circuit that produces the linearity improving signal and that is electrically coupled to the first input, the second input, the third input, and the output, the linearization circuit comprising:
a first circuit operable to deduct the first sample from the second sample to produce an intermediate signal;
a second circuit operable to form the linearity improving signal by adjusting at least one of a phase, an amplitude, and a delay of the intermediate signal according to a setting; and
a controller operable to adjust the setting according to intensity level of at least one spectral component of the third sample, the intensity level determined by attenuating at least one spectral component of the third sample via mixing down and filtering components of the third sample having a frequency at or near baseband of the amplifier,
further comprising at least one frequency converting mixer disposed between the first input and the first circuit, between the second input and the first circuit, or between the output and the second circuit.

15. The system of claim 14, wherein the location is downstream from the second input and the output.

16. The system of claim 14, wherein the first circuit comprises a canceller.

17. The system of claim 14, wherein the second circuit comprises a canceller.

* * * * *